US012571124B2

(12) United States Patent (10) Patent No.: US 12,571,124 B2
Sugawara et al. (45) Date of Patent: Mar. 10, 2026

(54) METHOD FOR MEASURING DISTANCE BETWEEN LOWER END SURFACE OF HEAT SHIELDING MEMBER AND SURFACE OF RAW MATERIAL MELT, METHOD FOR CONTROLLING DISTANCE BETWEEN LOWER END SURFACE OF HEAT SHIELDING MEMBER AND SURFACE OF RAW MATERIAL MELT AND METHOD FOR MANUFACTURING SILICON SINGLE CRYSTAL

(71) Applicant: SHIN-ETSU HANDOTAI CO., LTD., Tokyo (JP)

(72) Inventors: Kosei Sugawara, Nishigo-mura (JP); Takaki Imai, Nishigo-mura (JP); Masahiro Akiba, Nishigo-mura (JP); Katsuyuki Kitagawa, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 288 days.

(21) Appl. No.: 18/037,647

(22) PCT Filed: Oct. 11, 2021

(86) PCT No.: PCT/JP2021/037574
§ 371 (c)(1),
(2) Date: May 18, 2023

(87) PCT Pub. No.: WO2022/118537
PCT Pub. Date: Jun. 9, 2022

(65) Prior Publication Data
US 2024/0026565 A1 Jan. 25, 2024

(30) Foreign Application Priority Data
Dec. 1, 2020 (JP) ................................. 2020-199786

(51) Int. Cl.
*C30B 15/26* (2006.01)
*C30B 15/14* (2006.01)
(Continued)

(52) U.S. Cl.
CPC .............. *C30B 15/26* (2013.01); *C30B 15/14* (2013.01); *C30B 29/06* (2013.01); *C30B 30/04* (2013.01)

(58) Field of Classification Search
CPC ......... C30B 15/00; C30B 15/14; C30B 15/20; C30B 15/22; C30B 15/26; C30B 29/00;
(Continued)

(56) References Cited

U.S. PATENT DOCUMENTS 5,437,242 A * 8/1995 Hofstetter ............... C30B 15/26
117/14
5,487,354 A 1/1996 von Ammon et al.
(Continued)

FOREIGN PATENT DOCUMENTS

JP H06-56588 A 3/1994
JP H06-116083 A 4/1994
(Continued)

OTHER PUBLICATIONS

Ueki et al., "Analysis of Side-Wall Structure of Grown-In Twin-Type Octahedral Defects in Czochralski Silicon," Jpn. J. Appl. Phys., 1998, vol. 37, pp. 1667-1670.
(Continued)

*Primary Examiner* — Kenneth A Bratland, Jr.
(74) *Attorney, Agent, or Firm* — Oliff PLC

(57) ABSTRACT
A method for measuring distance between lower end surface of heat shielding member and surface of raw material melt, the method including providing the member being located above the melt, when a silicon single crystal is pulled by the Czochralski method while a magnetic field is applied to the
(Continued)

melt in a crucible, the method including: forming a through-hole in the member; measuring distance between the member and the melt surface, and observing position of mirror image of the through-hole with fixed point observation apparatus, the mirror image being reflected on the melt surface; then measuring a moving distance of the mirror image, and calculating distance between the member and the melt surface from a measured value and the moving distance of the mirror image, during the pulling of the crystal. The distance between the member and the melt can be precisely measured by the method.

11 Claims, 5 Drawing Sheets

(51) Int. Cl.
    *C30B 29/06*       (2006.01)
    *C30B 30/04*       (2006.01)
(58) Field of Classification Search
    CPC ......... C30B 29/02; C30B 29/06; C30B 30/00;
                                      C30B 30/04
    USPC ....... 117/11, 13–15, 200–202, 928, 931–932
    See application file for complete search history.

(56)                References Cited

U.S. PATENT DOCUMENTS 8,885,915 B2 *  11/2014  Sugawara  ............... C30B 29/06
                                             382/141

| | | |
|---|---|---|
| 9,260,796 B2 | 2/2016 | Hoshi et al. |
| 10,233,565 B2 | 3/2019 | Yamada et al. |
| 2002/0029738 A1 | 3/2002 | Takanashi et al. |
| 2002/0129759 A1* | 9/2002 | Fujiwara ................. C30B 29/06 |
| | | 117/33 |
| 2013/0058540 A1* | 3/2013 | Sugawara ............... C03B 29/06 |
| | | 382/106 |

FOREIGN PATENT DOCUMENTS

| | | |
|---|---|---|
| JP | H07-257991 A | 10/1995 |
| JP | 2001-342095 A | 12/2001 |
| JP | 2008-195545 A | 8/2008 |
| JP | 2012-001387 A | 1/2012 |
| JP | 2017-075066 A | 4/2017 |

OTHER PUBLICATIONS

Takeno et al., "Evaluation of Microdefects in As-Grown Silicon Crystals," Mat. Res. Soc. Symp. Proc., 1992, vol. 262, pp. 51-56.
Voronkov et al., "The Mechanism of Swirl Defects Formation in Silicon," Journal of Crystal Growth, 1982, pp. 625-643.
Hourai, et al. "Control of Grown-In Defects in Si Crystal Growth," Japanese Association For Crystal Growth, 1998, vol. 25, No. 5, pp. 207-213.
Nov. 9, 2021 International Search Report issued in International Patent Application No. PCT/JP2021/037574.
May 30, 2023 International Preliminary Report on Patentability issued in International Patent Application No. PCT/JP2021/037574.

* cited by examiner

[FIG. 1]
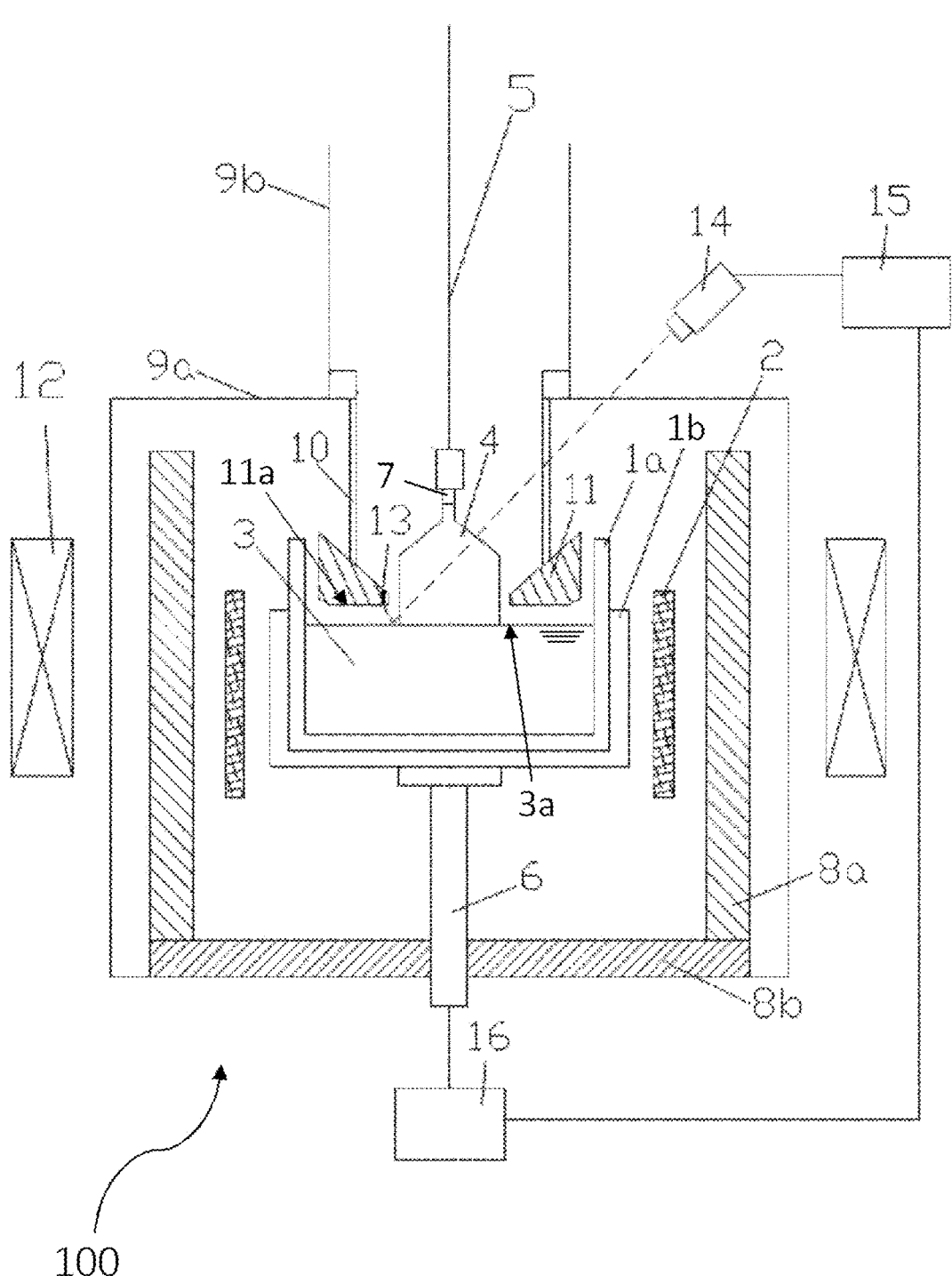

[FIG. 2]
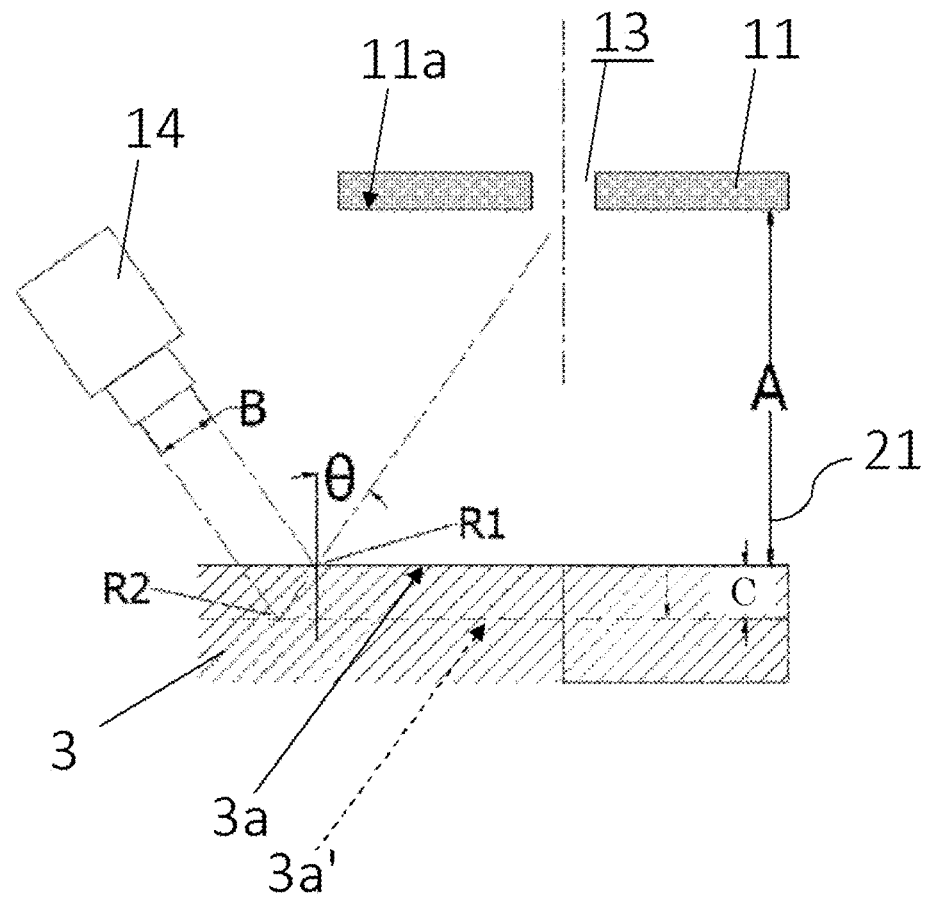
[FIG. 3]
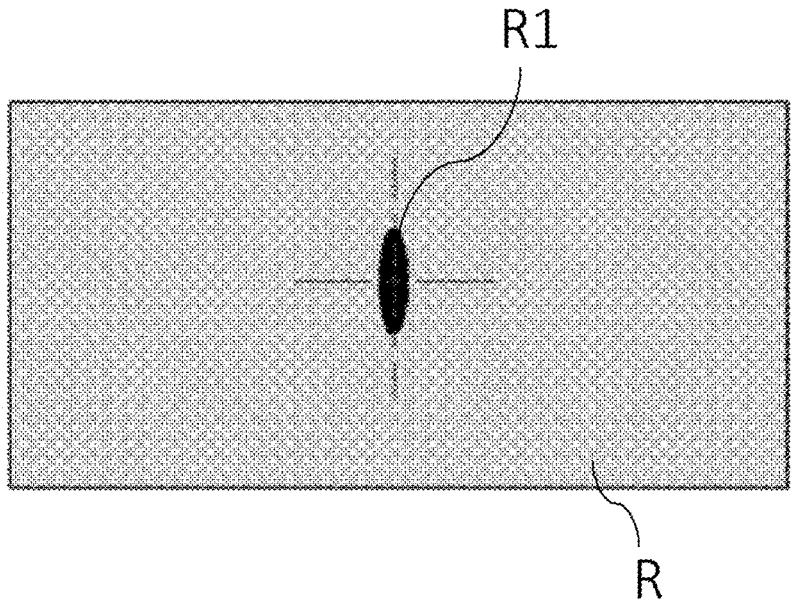

[FIG. 4]
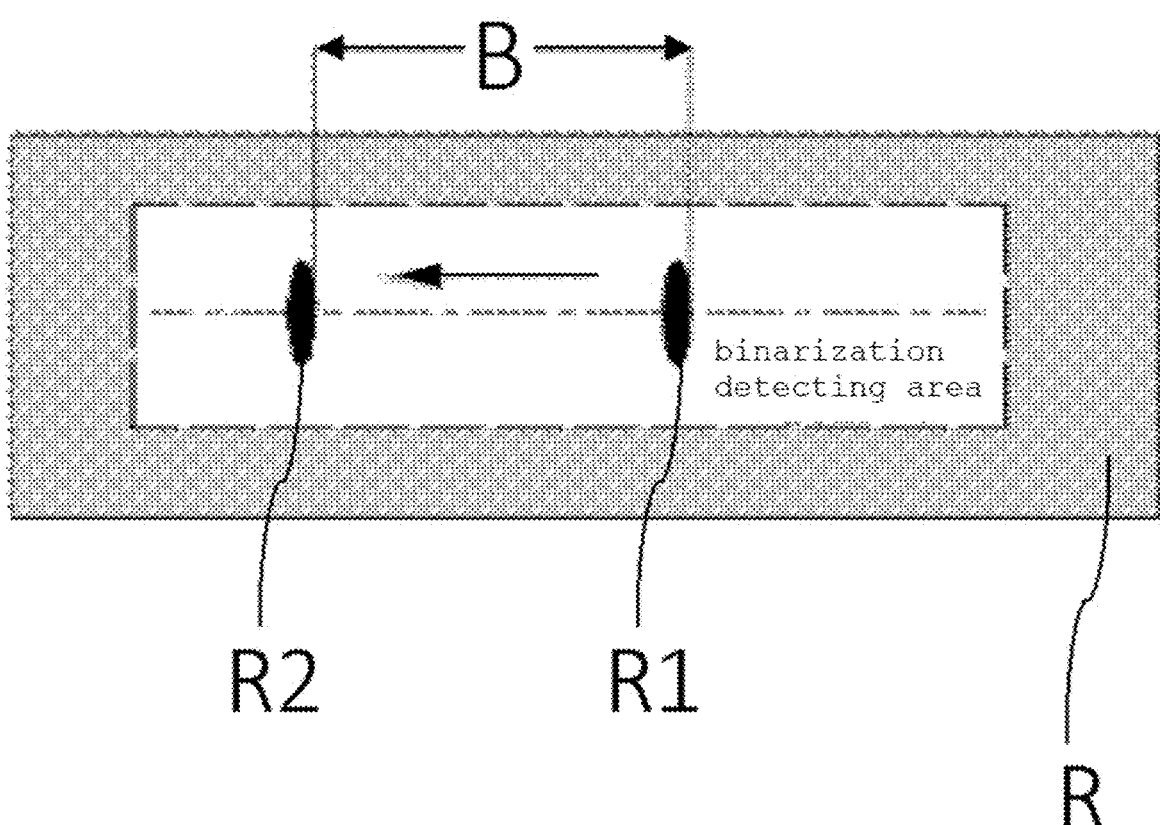

[FIG. 5]
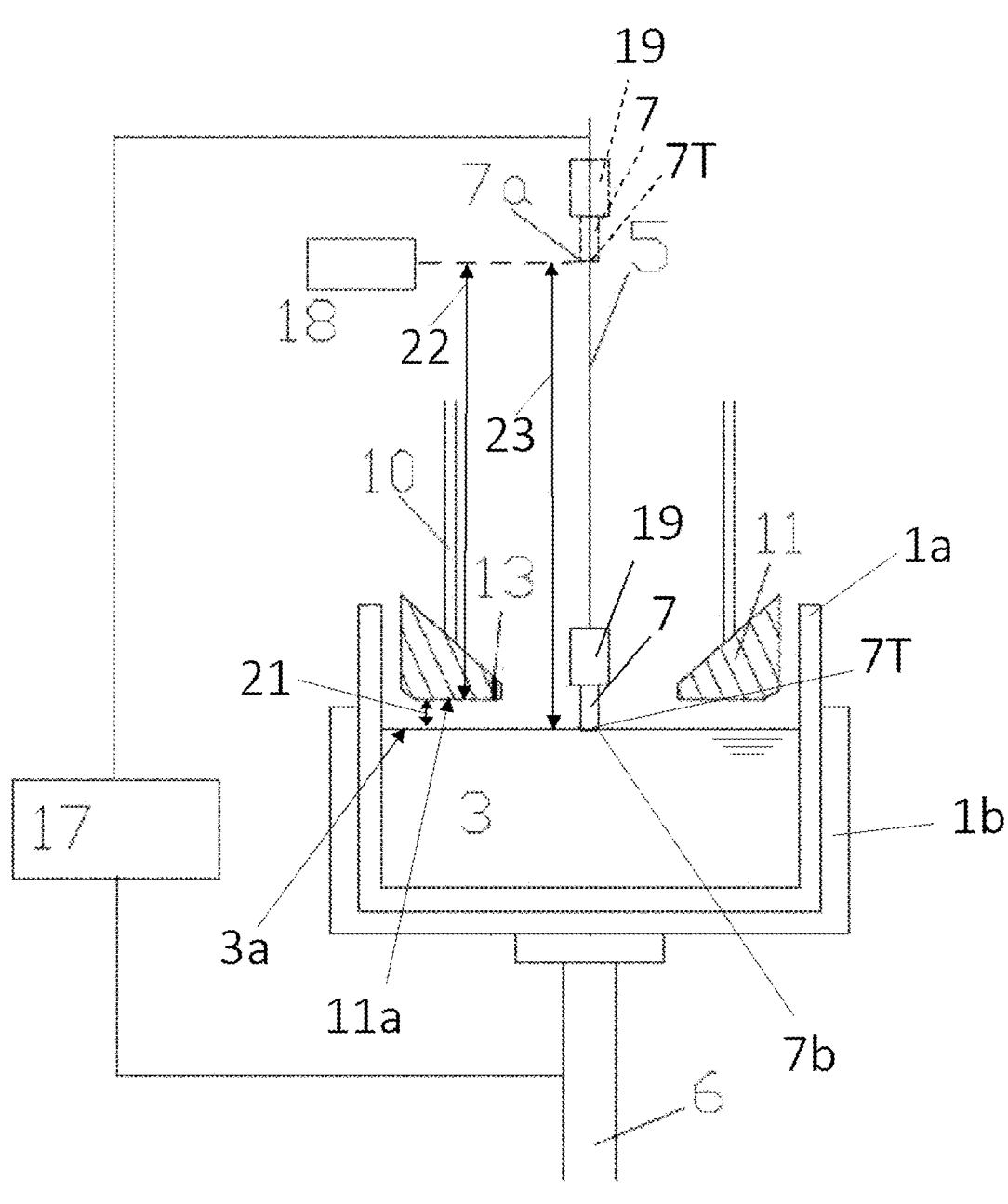

[FIG. 6]
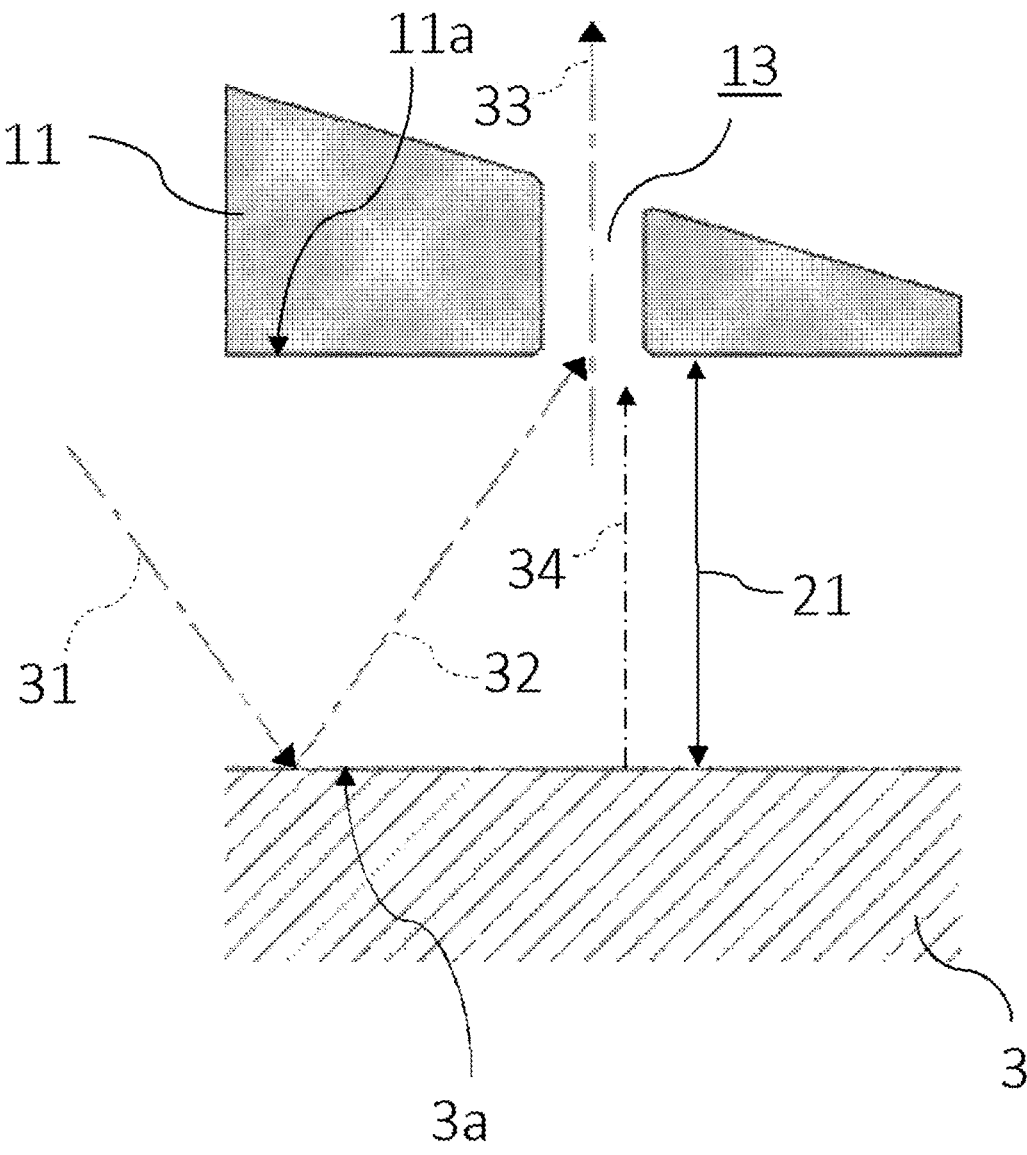

METHOD FOR MEASURING DISTANCE BETWEEN LOWER END SURFACE OF HEAT SHIELDING MEMBER AND SURFACE OF RAW MATERIAL MELT, METHOD FOR CONTROLLING DISTANCE BETWEEN LOWER END SURFACE OF HEAT SHIELDING MEMBER AND SURFACE OF RAW MATERIAL MELT AND METHOD FOR MANUFACTURING SILICON SINGLE CRYSTAL

TECHNICAL FIELD

The present invention relates to a method for measuring a distance between a lower end surface of a heat shielding member located above a surface of a raw material melt and the surface of the raw material melt when a silicon single crystal is pulled from the raw material melt in a crucible by the Czochralski method, a method for controlling the distance, and a method for manufacturing a silicon single crystal.

BACKGROUND ART

The Czochralski method (CZ method), in which a silicon single crystal is grown and pulled from a raw material melt in a quartz crucible, has been widely implemented as a method for manufacturing a silicon single crystal for use in fabrication of a semiconductor device. In the CZ method, a seed crystal is dipped into the raw material melt (silicon melt) in the quartz crucible under an inert gas atmosphere, and the seed crystal is pulled while the quartz crucible and the seed crystal are rotated so that a silicon single crystal having a desired diameter is grown.

In recent years, grown-in defects in silicon wafers become an issue as higher integration of semiconductor devices and accompanying shrinking feature sizes are advanced. The grown-in defects are a factor in deteriorated characteristics of semiconductor devices and the advancement of the shrinking feature sizes of a device is heightening the effect of the defect. An octahedral void-type defect, which is an agglomeration of vacancies (Non-Patent Document 1), and a dislocation cluster, which is formed as an agglomeration of interstitial silicon (Non-Patent Document 2), in a silicon single crystal by the CZ method are known as such grown-in defects.

There is disclosed that the amount of the grown-in defects being introduced depends on a temperature gradient at a crystal-growth interface and a growth rate of a silicon single crystal (Non-Patent Document 3). As a method for manufacturing a low defect silicon single crystal by utilizing the dependency, for example, Patent Document 1 discloses making the growth rate of a silicon single crystal slower, and Patent document 2 discloses that a silicon single crystal is pulled at a rate less than the maximum pulling rate that is substantially proportional to a temperature gradient at a boundary region between a solid phase and a liquid phase of the silicon single crystal. Moreover, an improved CZ method (Non-Patent Document 4) focusing attention to the temperature gradient (G) and the growth rate (V) during crystal growth has been reported. In this method, it is necessary to control the crystal temperature gradient with high precision.

In these methods, a structure (heat shielding member) in cylindrical form or inverted cone form for shielding radiant heat is provided around the silicon single crystal being grown above a melt surface to control the crystal temperature gradient. The structure enables the crystal temperature gradient of a high temperature crystal to increase and thus brings an advantage in that a defect-free crystal can be rapidly obtained. For precise control of the crystal temperature gradient, however, it is necessary to control highly precisely such that a distance between the lower end surface of the heat shielding member located above the surface of the raw material melt and the surface of the raw material melt (hereinafter, also referred to as DPM) is brought to a predetermined distance.

As the crystal diameter increases, the position of the melt surface widely varies in dependence on, for example, the weight (variation in thickness) of the quartz crucible, and deformation and expansion in its operation of the quartz crucible. Thus, there arises a problem in that the position of the melt surface varies every crystal growth batch. Because of the problem, controlling the distance between the melt surface and the heat shielding member precisely so as to maintain a predetermined distance becomes more difficult.

For solution of the problem, for example, Patent Document 3 proposes that a criterion reflector (criterion mark) be provided in a CZ furnace to measure the distance between the criterion reflector and the melt surface by measuring a relative distance between a real image of the criterion reflector and a mirror image of the criterion reflector reflected on the melt surface. In this method, the distance between the melt surface and the heat shielding member is controlled precisely on the basis of the measurement result so as to maintain a predetermined distance.

Further, Patent Document 4 discloses a method of considering the inclination of the raw material melt due to rotation of the crucible in order to obtain the stability of the mirror image of the criterion reflector. Further, Patent Document 5 discloses a method for improving positional error detection by making a reflected image appear clearly by applying a magnetic field. Patent Document 6 discloses a method for improving positional error detection by providing a criterion reflector inside a concavity formed on the lower end of the heat shielding member so that the reflected image can be seen more clearly due to the contrast between the reflector and the non-reflector.

In these methods, the real image of the criterion reflector and the mirror image of the criterion reflector are captured with a detection means such as an optical camera, and light-and-shade of each of the captured real image and mirror image of the criterion reflector is quantized (binarization) into two levels on the basis of a predetermined threshold (threshold for a binarization level). That is, the light and shade are distinguished by a lighter part or a darker part than the threshold for a binarization level. Measuring the position of the criterion reflector is performed and the measured value is converted so that the distance from the real image or the mirror image is measured.

However, there is a problem in that precise measurement of the distance between the criterion reflector and the melt surface cannot be ensured. As the causes of that, For example, with the passage of time in a crystal growth step, the brightness of the mirror image of the criterion reflector reflected on the melt surface varies, and the value detected by the optical camera varies before the binarization, or noise differing from that of the mirror image of the criterion reflector, such as a scattered melt attached to a structural part in the CZ furnace, is detected.

In Patent Document 6, in order to solve such a problem, by providing a criterion reflector inside a concavity formed on the lower end of the heat shielding member, the shadow of the mirror image of the criterion reflector is made clear, and fixed point observation by binarization is performed. However, even with this structure and detection method, the radiant light from the high-temperature silicon melt is strong, therefore the concavity formed on the lower end of the heat shielding member alone is insufficient light-and-shade so that erroneous detection may be caused. Furthermore, there is a problem that the amount of light increases further especially in narrow DPM, making it difficult to detect the criterion reflector.

Meanwhile, when, for example, the raw material melt is contained in a quartz crucible having a diameter of 800 mm or more, and a silicon single crystal having a diameter of 300 mm or more is manufactured without applying the magnetic field, there is another problem in that, since the melt surface vibrates, precise detection of the position of the melt surface cannot be ensured. In this case, also, precise measurement of the relative distance between the criterion reflector and the melt surface cannot be ensured.

When the measurement result of the relative distance between the criterion reflector and melt surface is inaccurate, the distance between the melt surface and the heat shielding member cannot be controlled precisely so as to maintain a predetermined distance. As a result, a silicon single crystal with desired quality cannot be manufactured at good productivity.

CITATION LIST

Patent Literature

Patent Document 1: JP H06-56588 A
Patent Document 2: JP H07-257991 A
Patent Document 3: JP H06-116083 A
Patent Document 4: JP 2001-342095 A
Patent Document 5: JP 2008-195545 A
Patent Document 6: JP 2012-1387 A

Non Patent Literature

Non Patent Document 1: Analysis of side-wall structure of grown-in twin-type octahedral defects in Czochralski silicon, JPN. J. Appl. Phys. Vol. 37 (1998) p-p. 1667-1670
Non Patent Document 2: Evaluation of microdefects in as-grown silicon crystals, Mat. Res. Soc. Symp. Proc. Vol. 262 (1992) p-p 51-56
Non Patent Document 3: The mechanism of swirl defects formation in silicon, Journal of Crystal growth, 1982, p-p 625-643
Non Patent Document 4: Japanese Association For Crystal Growth vol. 25 No. 5, 1998, p-p 207-213

SUMMARY OF INVENTION

Technical Problem

The present invention was accomplished in view of the above-described problems. It is an object of the present invention to provide a method for measuring a distance between a lower end surface of a heat shielding member and a surface of a raw material melt that enables precise measurement of the distance, a method for controlling a distance between a lower end surface of a heat shielding member and a surface of a raw material melt that stably enables precise control of the distance, and a method for manufacturing a silicon single crystal while precisely controlling the distance between the lower end surface of the heat shielding member and the surface of the raw material melt.

4

Solution to Problem

In order to solve the above problems, the present invention provides a method for measuring a distance between a lower end surface of a heat shielding member and a surface of a raw material melt, the method comprising providing the heat shielding member being located above the surface of the raw material melt, when a silicon single crystal is pulled by the Czochralski method while a magnetic field is applied to the raw material melt in a crucible, the method including:

forming a through-hole in the lower end surface of the heat shielding member;

actually measuring the distance between the lower end surface of the heat shielding member and the surface of the raw material melt, and observing a position of a mirror image of the through-hole with a fixed point observation apparatus, the mirror image being an image reflected on the raw material melt surface; and then measuring a moving distance of the mirror image by the fixed point observation apparatus, and calculating the distance between the lower end surface of the heat shielding member and the surface of the raw material melt from a value obtained in the actually measuring and the moving distance of the mirror image, during the pulling of the silicon single crystal.

According to such a measurement method, even when there is strong radiant light from the high-temperature raw material melt, or even in a state where the amount of light is further increased in a narrow DPM, the contrast between the through-hole and other parts in the mirror image can be maintained, the melt surface position can be measured with high accuracy, and the distance between the lower end surface of the heat shielding member and the surface of the raw material melt can be measured with high accuracy.

More specifically, in a heat shielding member having a through-hole in the lower end surface, even if there is strong radiation light from a high-temperature raw material melt, the radiation light passes through the through-hole portion, so that amount of the reflected light becomes extremely small, and a strong contrast of the light-and-shade can be formed between the through-hole and the reflecting portion of the lower end portion of the heat shielding member other than the through-hole. By detecting a dark part in such a strong light-and-shade, the through-hole can be detected with high accuracy even under the influence of strong radiant light from the high-temperature raw material melt, or even in a state where the amount of light increases further in a narrow DPM. Based on this, the distance between the lower end surface of the heat shielding member and the surface of the raw material melt can be measured with high accuracy.

In addition, when white quartz or transparent quartz, which has a lower emissivity than the graphite part used for the heat shield member, is used as the criterion reflector, even if the light-and-shade is clear with the heat shield, the difference in emissivity from the scattered portion of the raw material melt attaching to the lower end of the heat shielding member is small, and there are cases where the portion where the melt is scattered is erroneously detected. On the other hand, in the dark part detection by the through-hole in the measurement method of the present invention, not only the lower end of the heat shielding member other than the through-hole but also the melt scattered parts become bright parts it becomes effective to avoid erroneously detecting melt scattered parts.

Furthermore, when white quartz or transparent quartz is used for the criterion reflector, there are problems such as damage in long-term use due to heat load, contamination due to dropping during operation, and changes in detection values due to deformation. Such problems do not occur in the measuring method of the present invention using a heat shielding member provided with a through-hole.

Should be noted that, when only the concavity is formed at the lower end of the heat shielding member, the radiant light does not pass through, and the radiant light from multiple directions is reflected in the concavity, therefore, a clear dark part does not appear due to this reflected light although the light-and-shade is slightly clearer than the other part of the lower end of the heat shielding member. Only when the through-hole allow the passage of the radiant light as in the present invention, it is possible to form strong light-and-shade and greatly improve the detection accuracy.

For example, while observing the position of the mirror image of the through-hole, the through-hole can be detected as a dark portion, and the portion other than the through-hole is a bright portion in the mirror image of the lower end of the heat shielding member projected on the surface of the raw material melt.

According to the measuring method of the present invention, even when there is strong radiant light from the high-temperature raw material melt, or when the amount of light is further increased in a narrow DPM, the light-and-shade contrast of the mirror image of the lower end of the heat shielding member can be sufficiently obtained. Therefore, the DPM can be stably and accurately measured by detecting the through-hole in the mirror image of the lower end of the heat shielding member as a dark portion.

In the actual measurement of the distance between the lower end surface of the heat shielding member and the surface of the raw material melt, it is possible that a lower end of a seed crystal for growing the silicon single crystal is detected as a criterion position with a criterion position detector provided above the raw material melt; then the lower end of the seed crystal is lowered to between the lower end portion of the heat shielding member and the surface of the raw material melt; the lower end of the seed crystal is brought into contact with the surface of the raw material melt by raising the crucible; and the distance between the lower end surface of the heat shielding member and the surface of the raw material melt is actually measured on a basis of a distance from a position of the contact to the criterion position and a distance from the lower end surface of the heat shielding member to the criterion position.

Thus, the actual measurement of the distance between the lower end surface of the heat shielding member and the surface of the raw material melt can be performed by easy operation in which a lower end of a seed crystal for growing the silicon single crystal is detected as a criterion position with a criterion position detector provided above the raw material melt; then the lower end of the seed crystal is lowered to between the lower end portion of the heat shielding member and the surface of the raw material melt; the lower end of the seed crystal is brought into contact with the surface of the raw material melt by raising the crucible; and the distance between the lower end surface of the heat shielding member and the surface of the raw material melt is actually measured on a basis of a distance from a position of the contact to the criterion position and a distance from the lower end surface of the heat shielding member to the criterion position. In addition, since the distance between the lower end surface of the heat shielding member and the surface of the raw material melt is actually measured by using the seed crystal, the raw material melt is less likely to be contaminated with impurities, and a high quality silicon single crystal can be grown. Furthermore, by lowering the lower end of the seed crystal between the lower end of the heat shielding member and the surface of the raw material melt, there is no fear that the raw material melt adheres to the heat shielding member when the crucible is raised and the seed crystal comes into contact with the raw material melt surface.

In this case, a magnetic field strength at a center of the applied magnetic field can be, for example, a horizontal magnetic field of 10 G to 5000 G.

Alternatively, the applied magnetic field may be a cusp magnetic field.

By using a heat shielding member with a through-hole, there is no dark area in the lower end of the heat shielding member other than the through-hole, making the detection very easy. DPM measurement and control are possible even under weak magnetic field strength conditions, under which it has been difficult to detect the reflector, and can be applied to a horizontal magnetic field with a central magnetic field strength of several dozen G and a cusp magnetic field with a central magnetic field strength of approximately 0 G. Therefore, in the present invention, DPM measurement can be stably performed from a weak magnetic field strength of several dozen G to a strong magnetic field strength of 5000 G in a horizontal magnetic field and can also be applied in a cusp magnetic field with a central magnetic field strength of approximately 0 G.

For example, a horizontal cross-sectional shape of the through-hole may be circular or polygonal, and a diameter of the through-hole or a diameter of a circle circumscribing the through-hole may be 4 mm or more and 20 mm or less.

More preferably, the diameter of the through-hole or the diameter of the circle circumscribing the through-hole is 8 mm or more and 15 mm or less.

In the present invention, since the dark part is formed by allowing the radiant light to pass through the through-hole, the shape and size of the through-hole are not particularly limited. A horizontal cross-sectional shape of the through-hole may be circular or polygonal, and can have a diameter or a diameter of a circle circumscribing of 4 mm or more and 20 mm or less, more preferably 8 mm or more and 15 mm or less.

Furthermore, the present invention provides a method for controlling a distance between a lower end surface of a heat shielding member and a surface of a raw material melt, wherein the crucible or the heat shielding member is moved while the silicon single crystal is pulled such that the distance between the lower end surface of the heat shielding member and the surface of the raw material melt becomes a predetermined value on a basis of feedback from a distance between the lower end surface of the heat shielding member and the surface of the raw material melt, the distance being measured by the method for measuring the distance between the lower end surface of the heat shielding member and the surface of the raw material melt according to the present invention.

As described above, in the control method of the present invention, by using the heat shieling member having the through-hole, the mirror image of the through-hole reflected on the surface of raw material melt is detected as a dark portion. The heat shieling member having the through-hole enables, with a fixed point observation apparatus, highly accurate detection of the position of the mirror image reflected on the raw material melt surface of the lower end surface of the heat shielding member when the silicon single crystal is pulled. As a result, even when there is strong radiant light from the high-temperature raw material melt, or when the amount of light increases further with a narrow DPM, the contrast of light-and-shade in the mirror image of the lower end surface of the heat shielding member can be maintained, and the distance between the lower end surface of the heat shielding member and the surface the raw material melt surface can be stably and accurately measured and controlled.

In addition, compared to the case where white quartz or transparent quartz, which has a lower emissivity than the graphite parts used for the heat shielding member, is used as the criterion reflector, in the detection of a dark portion by the through-hole in the present invention, not only the lower end surface of the heat shielding member excluding the through-hole, but also the melt scattered parts becomes a bright portion, so it is possible to avoid erroneous detection of noise that is different from the mirror image of the criterion reflector, such as scattered melt attached to the structural parts in the CZ furnace.

In addition, compared to the case of using white quartz or transparent quartz as the criterion reflector, in the present invention in which the through-hole is used as the criterion reflector, damage in long-term use due to heat load, contamination due to dropping during operation, and deformation problems such as changes in detected values do not occur.

Here, the "criterion reflector" in the present invention means an object which is located on the lower end surface of the heat shielding member, and makes it possible to control the position of the raw material melt surface by observing the mirror image of the reflector reflected on the raw material melt surface and calculating the distance between the lower end surface of the heat shielding member and the raw material melt surface.

Furthermore, the present invention provides a method for manufacturing a silicon single crystal, wherein the silicon single crystal is manufactured while the distance between the lower end surface of the heat shielding member and the surface of the raw material melt is controlled by the method for measuring the distance between the lower end surface of the heat shielding member and the surface of the raw material melt according to the present invention.

When a silicon crystal is thus manufactured by the inventive method for manufacturing the silicon crystal, the distance between the lower end surface of the heat shielding member and the surface of the raw material melt can be highly accurately measured and controlled. Therefore, according to the inventive method for manufacturing the silicon crystal, the crystal axis temperature gradient in a direction of the crystal growth axis can be controlled highly precisely, and thereby a high quality silicon single crystal can be efficiently manufactured at high productivity.

Advantageous Effects of Invention

As described above, according to the method for measuring a distance between a lower end surface of a heat shielding member and a surface of a raw material melt of the present invention, the distance between the lower end surface of the heat shielding member and the surface of the raw material melt can be measured more stably and precisely.

According to the method for controlling the distance between the lower end surface of the heat shielding member and the raw material melt surface of the present invention, it is possible to control the distance between the lower end surface of the heat shielding member and the raw material melt surface with high accuracy by controlling the distance between the lower end surface of the heat shielding member and the raw material melt surface based on the measurement results of the measuring method of the present invention. Therefore, the crystal axis temperature gradient in the direction of the crystal growth axis can be controlled highly precisely, and a high quality silicon single crystal can be efficiently manufactured at high productivity. In addition, by controlling the distance between the lower end surface of the heat shielding member and the surface of the raw material melt such that it is not less than the lowest limit, the contact between the lower end surface of the heat shielding member and the surface of the raw material melt can be prevented, and the silicon single crystal can be grown safely.

Furthermore, according to the method for manufacturing a silicon single crystal of the present invention, the distance between the lower end surface of the heat shielding member and the raw material melt surface can be controlled with high precision by the control method of the present invention. Therefore, the crystal axis temperature gradient in the direction of crystal growth axis can be very precisely controlled, and high quality silicon single crystals can be efficiently manufactured with high productivity.

BRIEF DESCRIPTION OF DRAWINGS

FIG. 1 is a schematic diagram of a silicon single crystal pulling apparatus that can be used in the present invention;

FIG. 2 is a schematic diagram illustrating an example of a method of measuring the distance between the lower end surface of the heat shielding member and the raw material melt surface of the present invention;

FIG. 3 is a schematic diagram of an example of a mirror image of the lower end surface of the heat shielding member obtained by a fixed point observation apparatus in the arrangement of FIG. 2;

FIG. 4 is a schematic diagram of an example of the change in position of the mirror image of the lower end surface of the heat shielding member obtained by a fixed point observation apparatus in the arrangement of FIG. 2;

FIG. 5 is a diagram illustrating an example of a method of actually measuring the distance between the lower end surface of the heat shielding member and the raw material melt surface by using a seed crystal; and FIG. 6 is an enlarged schematic cross-sectional view of a part of the silicon single crystal pulling apparatus shown in FIG. 1;

DESCRIPTION OF EMBODIMENTS

The present invention will be described in more detail below.

As described above, conventionally, by providing a criterion reflector in a CZ furnace and measuring the relative distance between the real image of the criterion reflector and the mirror image of the criterion reflector reflected on the melt surface, distance between the criterion reflector and melt surface is measured. In this measurement, the real image of the criterion reflector and the mirror image of the criterion reflector are captured by a detection means such as an optical camera, and the light-and-shade in the captured real image and the captured mirror image of the criterion reflector is quantized into two output values (binarization processing) by a certain determined threshold (binary level threshold).

However, there was a problem in that precise measurement of the distance between the criterion reflector and melt surface cannot be stably ensured, when there is strong radiant light from a high-temperature silicon melt, or when the amount of light increases in a narrow DPM, the value detected by the optical camera before binarization processing may fluctuate, or, it becomes easy to detect noise that is different from the mirror image of the criterion reflector, such as melt scattered attaching to structural parts in the CZ furnace.

Further, for example, there has been a problem that in the case of manufacturing a silicon single crystal with a diameter of 300 mm or more, when the raw material melt surface vibrates, the criterion reflector becomes unclear and the accurate position of the melt surface cannot be stably detected. If the measurement result of the relative distance between the criterion reflector and the melt surface is inaccurate as in such a case, it is not possible to accurately control the space between the melt surface and the heat shielding member so as to be a predetermined distance. As a result, silicon single crystals of desired quality cannot be manufactured with good productivity.

Therefore, the present inventors have made intensive studies in order to solve such problems. As a result, the present inventors have been conceived of, in order to more stably and more accurately measure the distance between the lower end surface of the heat shielding member and the raw material melt surface at the time of pulling of silicon single crystal, providing the through-hole at a lower end of a heat shielding member positioned above the raw material melt surface to form a dark portion that suppresses the reflection of radiant light and making the lower end portion of the heat shielding member located above the raw material melt surface a bright portion, so as to providing strong light-and-shade contrast in a mirror image of a through-hole reflected on the raw material melt surface, and completed the invention.

That is, the present invention is a method for measuring a distance between a lower end surface of a heat shielding member and a surface of a raw material melt, the method comprising providing the heat shielding member being located above the surface of the raw material melt, when a silicon single crystal is pulled by the Czochralski method while a magnetic field is applied to the raw material melt in a crucible, the method including:

forming a through-hole in the lower end surface of the heat shielding member;

actually measuring the distance between the lower end surface of the heat shielding member and the surface of the raw material melt, and observing a position of a mirror image of the through-hole with a fixed point observation apparatus, the mirror image being an image reflected on the raw material melt; and then, measuring a moving distance of the mirror image by the fixed point observation apparatus, and calculating the distance between the lower end surface of the heat shielding member and the surface of the raw material melt from a value obtained in the actually measuring and the moving distance of the mirror image, during the pulling of the silicon single crystal.

Further, the present invention is also a method for controlling a distance between a lower end surface of a heat shielding member and a surface of a raw material melt, wherein the crucible or the heat shielding member is moved while the silicon single crystal is pulled such that the distance between the lower end surface of the heat shielding member and the surface of the raw material melt becomes a predetermined value on a basis of feedback from a distance between the lower end surface of the heat shielding member and the surface of the raw material melt, the distance being measured by the inventive method for measuring the distance between the lower end surface of the heat shielding member and the surface of the raw material melt.

Furthermore, the present invention is a method for manufacturing a silicon single crystal, wherein the silicon single crystal is manufactured while the distance between the lower end surface of the heat shielding member and the surface of the raw material melt is controlled by the inventive method for controlling the distance between the lower end surface of the heat shielding member and the surface of the raw material melt.

Hereinafter, the present invention will be described in detail with reference to the drawings, but the present invention is not limited thereto.

[Silicon Single Crystal Pulling Apparatus]

First, an example of a silicon single crystal pulling apparatus that can be used in the inventive method for measuring the distance between the lower end surface of the heat shielding member and the surface of the raw material melt, the inventive method for controlling the distance, and the inventive method for producing a silicon single crystal will be described with reference to FIG. 1. However, the apparatus in which the present invention can be implemented is not limited to that shown in FIG. 1, and the present invention can be implemented in other apparatuses as well.

A silicon single crystal pulling apparatus (manufacturing apparatus) 100 shown in FIG. 1 includes: a main chamber 9*a* which accommodates components such as a quartz crucible 1*a*; a pull chamber 9*b* which is continuously provided above the main chamber 9*a*; a heat shielding member 11 for controlling temperature gradient of a crystal; a gas flow-guide cylinder 10 which is continuously provided above the heat shielding member 11; a heater 2 for heating and melting the polycrystalline silicon raw material charged in the quartz crucible 1*a*; a graphite crucible 1*b* that supports the quartz crucible 1*a*; a heat insulating material (a heat insulating cylinder 8*a* and a heat insulating plate 8*b*) for preventing the heat from the heater 2 from being directly radiated to the main chamber 9*a*; a wire 5 for pulling the silicon single crystal; a crucible shaft 6 supporting the quartz crucible 1*a* and the graphite crucible 1*b*; and a controller 16 configured to control the positions of the quartz crucible 1*a* and the graphite crucible 1*b* via the crucible shaft 6.

The heat from the heater 2 melts the polycrystalline silicon raw material in the quartz crucible 1*a* to form the raw material melt 3 shown in FIG. 1. The silicon single crystal manufacturing apparatus 100 further includes a magnetic field generator 12 configured to apply a magnetic field to the raw material melt 3.

A seed crystal 7 for growing a silicon single crystal 4 is attached to the lower end of the wire 5.

In addition, the silicon single crystal manufacturing apparatus 100 further includes: a fixed point observation apparatus 14 configured to detect a mirror image of the lower end surface 11*a* of the heat shielding member 11 projected onto the surface 3*a* of the raw material melt 3; and a measurement arithmetic unit electrically connected to the fixed point observation apparatus 14 and the controller 16.

The heat shielding member 11 shown in FIG. 1 will be described in detail later.

Should be noted that although the fixed point observation apparatus 14 is not particularly limited, for example, a commonly used optical camera (such as a CCD camera) can be used.

[Method of Measuring Distance Between Lower End Surface of Heat Shielding Member and Raw Material Melt Surface]

The method of the present invention is a method for measuring a distance between a lower end surface of a heat shielding member and a surface of a raw material melt, the method including providing the heat shielding member being located above the surface of the raw material melt, when a silicon single crystal is pulled by the Czochralski method while a magnetic field is applied to the raw material melt in a crucible, the method including:

forming a through-hole in the lower end surface of the heat shielding member;

actually measuring the distance between the lower end surface of the heat shielding member and the surface of the raw material melt, and observing a position of a mirror image of the through-hole with a fixed point observation apparatus, the mirror image being an image reflected on the raw material melt surface; and then measuring a moving distance of the mirror image by the fixed point observation apparatus, and calculating the distance between the lower end surface of the heat shielding member and the surface of the raw material melt from a value obtained in the actual measuring and the moving distance of the mirror image, during the pulling of the silicon single crystal.

Hereinafter, an example of the method for measuring the distance between the lower end surface of the heat shielding member and the surface of the raw material melt of the present invention will be described with reference to FIG. 1 again and FIGS. 2 to 4.

FIG. 2 is a schematic diagram for explaining an example of the method for measuring the distance between the lower end surface of the heat shielding member and the surface of the raw material melt of the present invention, showing the movement of the surface of the raw material melt and the positional relationship of each member. FIG. 3 is a schematic diagram of an example of a mirror image of the lower end surface of the heat shielding member, obtained with a fixed point observation apparatus in the arrangement of FIG. 2. FIG. 4 is a schematic diagram of an example of the positional change of the mirror image of the lower end surface of the heat shielding member, obtained by a fixed point observation apparatus in the arrangement of FIG. 2.

In the single crystal pulling apparatus 100 shown in FIG. 1, as schematically shown in FIG. 2, a through-hole 13 serving as a criterion reflector is provided in the lower end surface 11a (hereinafter, heat shielding member lower end surface 11a) of the heat shielding member 11 positioned above the melt surface 3a (hereinafter, raw material melt surface 3a) of raw material melt 3.

The through-hole 13 is different from the opening through which the pulled silicon single crystal 4 passes, as shown in FIG. 1. As shown in FIG. 1, the through-hole 13 penetrates the heat shielding member 11 in the pulling direction of the silicon single crystal 4, that is, in a direction substantially parallel to the crystal growth axis direction. One end of the through-hole 13 opens to the lower end surface 11a (heat shielding member lower end surface 11a) of the heat shielding member 11.

Next, the distance 21 (shown in FIG. 2) between the heat shielding member lower end surface 11a and the raw material melt surface 3a is actually measured, and as shown in FIG. 2, the position of the mirror image R1 of the through-hole 13 as criterion reflector is observed by the fixed point observation apparatus 14, in which the mirror image is an image reflected on the raw material melt surface 3a. FIG. 3 shows: a mirror image R of the heat shielding member lower end surface 11a observed by the fixed point observation device 14 in the arrangement of FIG. 2; and a mirror image R1 of the through-hole 13 included therein. Then, during the pulling of the silicon single crystal 4, the movement distance B of the mirror image of the through-hole 13 is measured by the fixed point observation apparatus 14, and from the actually measured value A and the movement distance B of the mirror image, a distance 21 (hereinafter also referred to as DPM 21) between the heat shielding member lower end surface 11a and the raw material melt surface 3a is calculated. A specific example of the calculation means will be described later. FIG. 4 schematically shows the movement of the mirror image R of the through-hole 13 from the position R1 to the position R2 in the mirror image R, observed by the fixed point observation apparatus 14.

By thus using the through-hole 13 formed in the heat shielding member lower end surface 11a as a criterion reflector, the radiation light from the raw material melt 3 passes through the through-hole 13, so that the amount of reflected light is extremely reduced. A strong light-and-shade contrast can be formed between the through-hole 13 and the reflection portion of the heat shielding member lower end surface 11a other than the through-hole 13, the fluctuation of the detected value by the binary value processing is suppressed and the distance between the heat shielding member lower end surface 11a and the raw material melt surface 3a can be stably and accurately measured.

Moreover, the through-hole 13 may be formed so that the radiant light can pass therethrough to form a dark portion, and the shape and size of the through-hole 13 are not particularly limited. For example, the horizontal cross-sectional shape may be circular or polygonal, and the diameter of the through-hole 13 or the diameter of circle circumscribing the through-hole 13 may be 4 mm or more and 20 mm or less (more preferably 8 mm or more and 15 mm or less), the area of upper and lower ends of the through-hole 13 are not necessarily the same, and may be different. As for a position where the through-hole 13 is formed, so long as the reflected image (mirror image) of the heat shielding member lower end surface 11a including the through-hole 13 can be observed by the fixed point observation apparatus 14, there is no need to limit the providing position. Should be noted that as described above, the through-hole 13 is different from the opening of the heat shielding member 11 through which the silicon single crystal 4 to be pulled passes. Although the direction in which through-hole 13 extends is not particularly limited, it preferably extends in a direction (vertical direction) substantially parallel to the crystal growth axis direction.

In addition, even if the temperature of the raw material melt 3 and the entire furnace (main chamber 9a) becomes higher and the radiant light increases, or even if the DPM (the distance between the heat shielding member lower end surface 11a and the raw material melt surface 3a) becomes narrow and the amount of light increases due to multiple radiation from the raw material melt surface 3a and the heat shielding member lower end surface 11a, since the radiant light from the raw material melt 3 passes through the through-hole 13, the mirror image of the through-hole 13 through which the radiated light passes and the mirror image of the other part of the heat shielding member lower end surface 11a that is brightened by reflection are made to have a stronger light-and-shade contrast. Thus, even in a state where the amount of light is further increased the effect of strong radiant light from the high-temperature raw material melt 3 and the narrow DPM, the distance between the heat shielding member lower end surface 11*a* and the raw material melt surface 3*a* can be measured with high accuracy.

Furthermore, compared to the case of using white quartz or transparent quartz with lower emissivity than the graphite part used for the heat shielding member for the criterion reflector, regarding the scattered part of the silicon melt attaching to the lower end of the heat shielding member, which may cause erroneous detection when using white quartz or transparent quartz with lower emissivity, it is also useful to prevent the erroneously detecting the melt scattered parts because the through-hole 13, which is to be a dark portion, forms a light-and-shade contrast.

In addition, the use of white quartz or transparent quartz as the criterion reflector causes problems such as breakage in long-term use due to heat load, contamination due to dropping during operation, and changes in detection values due to deformation. Meanwhile, since the through-hole 13 is an insubstantial cavity that does not lead to breakage, such a problem does not occur.

In addition, in the case of the heat shielding member 11 provided with the through-hole 13 as the criterion reflector, there is no dark portion other than the through-hole 13 on the heat shielding member lower end surface 11*a*. Therefore, DPM measurement and control are made possible even under weak magnetic field strength conditions, where it has been difficult to detect reflectors in the past. It can also be applied in the case that magnetic field strength at a center of the magnetic field applied is a horizontal magnetic field of several dozen G or magnetic field strength at a center of the magnetic field applied is a cusp magnetic field of approximately 0 G.

Here, as an example of actually measuring the distance 21 between the heat shielding member lower end surface 11*a* and the raw material melt surface 3*a*, there is an embodiment as shown in FIG. 5. FIG. 5 is a diagram illustrating an example of a method of actually measuring the distance between the heat shielding member lower end surface and the raw material melt surface.

A case of actually measuring the distance 21 between the heat shielding member lower end surface 11*a* and the raw material melt surface 3*a* by using the seed crystal 7 as shown in FIG. 5 will be described.

First, the lower end 7T of the seed crystal 7 for growing the silicon single crystal 4 shown in FIG. 1 is detected by the criterion position detector 18 arranged above the raw material melt surface 3*a* detects and the position is set as seed crystal criterion position 7*a*. In FIG. 5, the seed crystal 7 is held by a seed crystal holder 19 connected to the lower end of the wire 5.

On the other hand, a distance 22 from the heat shielding member lower end surface 11*a* to the seed crystal criterion position 7*a* is obtained.

Thereafter, the lower end 7T of the seed crystal 7 is lowered between the lower end surface 11*a* of the heat shielding member 11 provided with the through-hole 13 serving as the criterion reflector and the raw material melt surface 3*a*. At this time, the lower end 7T of the seed crystal 7 is stopped at a predetermined criterion position 7*b* where the position of the raw material melt surface 3*a* becomes a desired DPM 21 when the lower end 7T of the seed crystal 7 is to be brought into contact with the melt surface 3*a* of the raw material melt 3 by raising the crucibles 1*a* and 1*b*.

Then, the crucibles 1*a* and 1*b* are raised by using the crucible shaft 6 to bring the lower end 7T of the seed crystal 7 and the melt surface 3*a* of the raw material melt 3 into contact at the predetermined criterion position 7*b*. The position 7*b* of this contact becomes a criterion position at the time of contact with the seed crystal and the raw material melt, and the distance 23 between this position 7*b* and the seed crystal criterion position 7*a* can be measured. Based on the measured value of this distance 23 and the distance 22, which has been known in advance, from the heat shielding member lower end surface 11*a* to the seed crystal reference position 7*a*, the distance 21 between the heat shielding member lower end surface 11*a* and the raw material melt surface 3*a* can be measured to obtain the actually measured value A.

By the thus actual measurement of the distance 21 between the heat shielding member lower end surface 11*a* and raw material melt surface 3*a* by using the seed crystal 7 to obtain actually measured value A, the actual measurement of the distance 21 between the heat shielding member lower end surface 11*a* and the raw material melt surface 3*a* can be performed with a simple operation. This actual measurement of the distance 21 between the heat shielding member lower end surface 11*a* and the raw material melt surface 3*a* by using the seed crystal 7 also reduces the risk of contaminating the raw material melt 3 by impurities because the distance 21 between the heat shielding member lower end surface 11*a* and the raw material melt surface 3*a* is measured by using the seed crystal 7. As a result, high quality silicon single crystal can be grown. Also, by lowering the lower end 7T of the seed crystal 7 to between the heat shielding member lower end surface 11*a* and the raw material melt surface 3*a*, there is less risk of attaching the raw material melt 3 to the heat shielding member 11 when the crucibles 1*a* and 1*b* are raised to bring the seed crystal 7 into contact with the surface 3*a* of the raw material melt.

In order to detect the contact between the seed crystal 7 and the raw material melt 3, a wire 5 for hanging the seed crystal 7 and a crucible shaft 6 supporting the crucibles 1*a* and 1*b* in which the raw material melt 3 is charged are electrically connected to each other via an actual measuring device 17, as shown in FIG. 5. When the raw material melt 3 contacts the seed crystal 7 by raising the crucibles 1*a* and 1*b*, the actual measuring device 17 detects the contact in an electrical manner. At the time, the crucible position is recorded. The distance 21 between the heat shielding member lower end surface 11*a* and the raw material melt surface 3*a* can be actually measured at the crucible position, i.e., a position of the raw material melt surface 3*a*.

Then, by the above-described method, the actually measured value A of the distance 21 between the heat shielding member lower end surface 11*a* and the raw material melt surface 3*a* is obtained. At the same time, the position of the mirror image R1 of through-hole 13 as the criterion reflector projected and reflected on the raw material melt surface 3*a* is observed by the fixed point observation apparatus 14.

Next, the silicon single crystal 4 is pulled using the silicon single crystal pulling apparatus 100 shown in FIG. 1.

The silicon single crystal 4 can be pulled by such a pulling apparatus 100 as follows. Before actually measuring the distance 21 between the heat shielding member lower end surface 11*a* and the raw material melt surface 3*a*, a high-purity polycrystalline silicon raw material is previously charged in the quartz crucible 1*a* and the raw material melt 3 is prepared by heating and melting the silicon above the melting point (approximately 1420° C.) by the heater 2 placed around the graphite crucible 1*b*. Then, the distance 21 between the heat shielding member lower end surface 11*a* and the raw material melt surface 3*a* is actually measured as described above, and the position of the mirror image R1 of the through-hole 13 which is the criterion reflector, reflected on the raw material melt surface 3a, is observed by the fixed point observation apparatus 14.

Next, a method for measuring the distance 21 between the heat shielding member lower end surface 11a and the raw material melt surface 3a during pulling of the silicon single crystal 4 will be described.

When the silicon single crystal is pulled from the raw material melt 3 contained in the quartz crucible 1a, the melt surface 3a of the raw material melt 3 is lowered. For example, as shown in FIG. 2, when the melt surface 3a of the raw material melt 3 descends to a melt surface 3a' at a new position, the position of the mirror image of through-hole 13, serving as the criterion reflector projected onto the melt surface 3a of the raw material melt 3 moves from the position R1 captured as described above by the fixed point observation apparatus 14 before pulling the silicon single crystal 4 to the position R2 corresponding to the melt surface 3a' shown in FIG. 2.

In this case, as shown in FIG. 4, with a measurement arithmetic unit 15 connected with the fixed point observation apparatus 14, the movement distance B of the mirror image from the position R1 to the position R2 is converted into the movement distance C of the surface of the raw material melt, the movement distance C being the distance from the position 3a to the position 3a'. This conversion can be carried out geometrically from the position and angle of the fixed point observation apparatus 14 and so on as follows:

$$B = 2C \sin \theta,$$

wherein C represents the movement distance of the raw material melt 3, B represents the movement distance of the mirror image, and $\theta$ represents the angle of reflection of the mirror image. Based on this equation, the movement distance C of the raw material melt can be calculated from the movement distance B of the mirror image obtained by the fixed point observation apparatus 14. The DPM 21 when the mirror image is at the position R2 can be calculated by adding the movement distance C of the raw material melt to the actually measured value A, which has been known in advance.

When $\theta$ is more than 30°, C is less than B, and slight movement of the melt surface 3a of the raw material melt 3 can be measured in a such manner that it is enlarged by the movement of the mirror image of through-hole 13 and the amount of change (moving distance) C can be measured from actually-measured value A of DPM 21.

However, in order to calculate the DPM 21 more accurately, before pulling the silicon single crystal 4, for example, a conversion coefficient may be obtained based on the moving distance B of the mirror image of the through-hole 13, where the moving distance B is observed when the crucible position, that is, the melt surface 3a of the raw material melt 3 is further lowered by 20 mm from the reference position.

By doing so, by simply observing the moving distance B of the mirror image of the through-hole 13 with the fixed point observation apparatus 14 during the pulling of the silicon single crystal 4, the DPM 21 between the lower end surface 11a of the heat shielding member 11 and the melt surface 3a of the raw material melt 3 can be calculated with high accuracy based on the actually-measured DPM value A before the pulling of the silicon single crystal 4 and the moving distance C of the melt surface 3a of the raw material melt 3 calculated from the moving distance B of the mirror image of the through-hole 13. The DPM 21 before the silicon single crystal 4 is pulled is calculated based on the actually measured value A by the crucible position controller 16.

Thus, according to the inventive method for measuring the distance between the heat shielding member lower end surface and the raw material melt surface, even during the pulling of the silicon single crystal, the distance between the heat shielding member lower end surface and the raw material melt surface can be stably and accurately measured.

[Method for Controlling Distance Between Lower End Surface of Heat Shielding Member and Surface of Raw Material Melt]

The inventive method for controlling the distance between the lower end surface of the heat shielding member and the raw material melt surface is a method for controlling a distance between a lower end surface of a heat shielding member and a surface of a raw material melt, wherein the crucible or the heat shielding member is moved while the silicon single crystal is pulled such that the distance between the lower end surface of the heat shielding member and the surface of the raw material melt becomes a predetermined value on a basis of feedback from a distance between the lower end surface of the heat shielding member and the surface of the raw material melt, measured by the inventive method for measuring the distance between the lower end surface of the heat shielding member and the surface of the raw material melt surface.

In the method for controlling the distance between the lower end surface of the heat shielding member and the surface of the raw material melt of the present invention, to control the distance between the lower end surface of the heat shielding member and the surface of the raw material melt, the moving distance of the mirror image is observed at a fixed point during pulling of the silicon single crystal, the distance between the lower end surface of the heat shielding member and the surface of the raw material melt measured by the inventive method of measuring the distance between the lower end surface of the heat shielding member and surface the raw material melt surface, which is described above, is fed back at any time.

In the case of using the silicon single crystal pulling apparatus as shown in FIG. 1, the crucibles 1a and 1b or the heat shielding member 11 are/is moved so that the distance 21 between the heat shielding member lower end surface 11a and the raw material melt surface 3a becomes a predetermined value. The crucibles can be moved by moving the crucible shaft 6 up and down, and the heat shielding member 11 can be moved by, for example, moving a gas flow-guide cylinder continuously provided to the heat shielding member 11 up and down by means of a gas flow-guide cylinder moving mechanism (not shown).

In this way, the DPM measurement value is fed back during the pulling of the silicon single crystal, and the crucibles or the heat shielding member are/is moved so that the distance between the lower end surface of the heat shielding member and the raw material melt surface becomes the predetermined value, and thereby, the distance between the lower end surface of the heat shielding member and the raw material melt surface can be controlled with high accuracy.

Here, the reason why the distance between the lower end surface of the heat shielding member and the raw material melt surface can be controlled with high accuracy will be described in more detail.

FIG. 6 is an enlarged schematic sectional view of a part of the silicon single crystal pulling apparatus shown in FIG. 1. For example, as shown in FIG. 6, incident light 31 is incident on the raw material melt surface 3a, and at least a part of it is reflected from the raw material melt surface 3a as reflected light 32 and is incident on the heat shielding member lower end surface 11a. Since this reflected light 32 passes through the through-hole 13 opened in the heat shielding member lower end surface 11a as light 33, reflection of the light is suppressed at the portion of the through-hole 13. In addition, since the radiant light 34 from the raw material melt 3 also passes through the through-hole 13, reflection of the light is suppressed at the portion of the through-hole 13. On the other hand, the portion of the heat shielding member lower end surface 11a other than the through-hole 13 reflects at least a part of the reflected light 32 and the radiant light 34 from the raw material melt 3, and the reflected light reaches the raw material melt 3. As a result, in the mirror image R observed by the fixed point observation apparatus 14 of the heat shielding member lower end surface 11a projected onto the raw material melt surface 3a, as shown in FIG. 3, the through-hole 13 appears as a dark portion R1 and the other part appears as a bright portion.

In this way, by using the through-hole 13 opened in the heat shielding member lower end surface 11a as a criterion reflector, the light such as the radiant light from the raw material melt 3 passes through the through-hole 13, so that the amount of reflected light is extremely small, and, in the mirror image R, a strong light-and-shade contrast can be formed between the portion R1 of the through-hole 13 and the reflected portion of the heat shielding member lower end surface 11a other than the through-hole 13. In the mirror image R thus obtained, the variation of the detected value due to the binary value processing is suppressed, so the mirror image can exhibit highly reliability as the mirror image in the state matched with the predetermined value of the distance (DPM) 21 between the heat shielding member lower end surface 11a and the raw material melt surface 3a.

In addition, according to the inventive method of measuring the distance between the heat shielding member lower end surface and the raw material melt surface, even during the pulling of the silicon single crystal, the distance (DPM) between the lower end surface of the heat shielding member and the raw material melt surface can be measured more stably and more accurately, as described above. In the control method of the present invention, by feeding back the measurement result and moving the crucibles or the heat shielding member so that the DPM becomes the predetermined value, the deviation value of the DPM from the predetermined value can be corrected at any time.

Therefore, according to the inventive method for controlling the distance between the heat shielding member lower end surface and the surface of the raw material melt, the distance between the heat shielding member lower end surface and the surface of the raw material melt can be controlled with high precision even during the pulling of the silicon single crystal.
[Silicon Single Crystal Manufacturing Method]

The silicon single crystal manufacturing method of the present invention includes: controlling the distance between the heat shielding member lower end surface and the surface of the raw material melt by the inventive method of controlling the distance between the heat shielding member lower end surface and the surface of the raw material melt, and manufacturing a silicon single crystal.

The distance (DPM) between the raw material melt and the heat shielding member provided above the melt is very important to grow a high quality silicon single crystal, such as a defect-free crystal. This is because a manufacturing margin of the defect-free crystal is very narrow and the defect-free crystal needs to achieve a defect-free state in all directions in a crystal plane; the temperature gradient near a crystal widely varies in dependence on a change of DPM; therefore, the DPM can be used as a control factor to equalize the temperature gradient at the center with that at the periphery. Since the temperature gradient in a crystal plane varies in a crystal length direction, the DPM needs to be changed according to the crystal length to manufacture a crystal with no defect across a crystal length direction.

In view of this, by manufacturing the silicon single crystal while the distance between the lower end surface of the heat shielding member and the surface of the raw material melt is controlled by the above the inventive method as described above for controlling the distance between the lower end surface of the heat shielding member and the surface of the raw material melt, the distance between the lower end surface of the heat shielding member and the surface of the raw material melt can be controlled with high precision. Therefore, the crystal axis temperature gradient in a crystal growth axis direction can be controlled highly precisely, and a high quality silicon single crystal can be efficiently manufactured at high productivity.

Furthermore, in the silicon single crystal manufactured by the above-described method for manufacturing a silicon single crystal, there is no defect on the entire plane in a radial direction and thus the defect-free region expands in the silicon single crystal so that the yield of the silicon single crystal manufacture is further improved.

Thus, by manufacturing a silicon single crystal by the silicon single crystal manufacturing method of the present invention, the distance between the heat shielding member lower end surface and the raw material melt surface can be measured and controlled with high accuracy, so that the crystal axis temperature gradient in the growth axis direction can be controlled very precisely, and high quality silicon single crystals can be efficiently produced.

EXAMPLES

The present invention will be specifically described below using Example and Comparative Example, but the present invention is not limited to these.

Example

In the Example, the pulling of the silicon single crystals were performed according to the following procedure.

A silicon single crystal pulling apparatus 100 having the same configuration as that shown in FIG. 1 was provided as a silicon single crystal pulling apparatus. The heat shielding member 11 used having a long-life scattered melt attached to it, and being provided a circular through-hole 13 with a diameter of mm formed as a criterion reflector on the lower end surface 11a of the heat shielding member 11 at a position where mirror image of the through-hole 13 could be measured by a fixed point observing apparatus 14.

In the provided silicon single crystal pulling apparatus 100, a quartz crucible 1a with a diameter of 800 mm (for pulling a silicon single crystal with a diameter of 300 mm) was filled with 360 kg of polycrystalline silicon raw material. After the polycrystalline silicon raw material was melted by the heater 2 to form the raw material melt 3, the magnet 12 applied a horizontal magnetic field with a central magnetic field strength of 4000 G to the raw material melt.

After that, by using the seed crystal 7, the distance (DPM) 21 between the lower end surface 11a of the heat shielding member 11 and the melt surface 3a of the raw material melt 3 was measured. The method of actual measurement was performed as follows. First, as shown in FIG. 5, the lower end 7T of the seed crystal 7 was detected by the criterion position detector 18, and the detected position was defined as the seed crystal criterion position 7a. A distance 22 from the heat shielding member lower end surface 11a to the seed crystal criterion position 7a was obtained from the dimensions of the gas flow-guide cylinder and the heat shielding member 11. Thereafter, the seed crystal 7 was lowered and the lower end 7T of the seed crystal 7 was stopped at the predetermined position where the crucibles 1a and 1b were to be raised to bring the melt surface 3a of the raw material melt 3 into contact with the lower end 7T of the seed crystal 7. Next, the crucibles 1a and 1b were raised to bring the lower end 7T of the seed crystal 7 and the melt surface 3a of the raw material melt 3 into contact. Then, the distance 23 from this contact position (reference position at the time of contact the seed crystal with the raw material melt) 7b to the seed crystal reference position 7a was determined. The difference between this distance 23 and the previously obtained distance 22 from the heat shielding member lower end surface 11a to the seed crystal reference position 7a was actually measured as the distance (DPM) 21 between the lower end surface 11a of the heat shielding member 11 and the melt surface 3a of the raw material melt 3. The contact between the melt surface 3a of the raw material melt 3 and the seed crystal 7 was detected by sensing the electricity flowing from the seed crystal 7 to the crucible shaft 6 with the actual measuring device 17. The value of the distance 21 at the moment of sensing was set as the predetermined value A. At this time, the position R1 of the mirror image of the through-hole 13 projected onto the raw material melt surface 3a was detected by a fixed point observation apparatus (camera) 14. At this time, the conversion coefficient was also determined at the same time. That is, the movement distance B of the mirror image R1 of the through-hole 13 when the crucibles 1a and 1b were lowered by 20 mm (the movement distance C of the raw material melt surface shown in FIG. 2) was measured. This made it possible to calculate the movement distance C of the melt surface 3a of the raw material melt 3 from the movement distance B of the mirror image of the through-hole 13 during the pulling of the silicon single crystal 4 was measured.

With the above settings completed, the predetermined values A of the DPM 21 were set to 100 mm, 50 mm and 20 mm, respectively, and one silicon single crystal was pulled under each of the following conditions while applying a magnetic field under each magnetic field condition, and measuring and controlling the DPM 21 to the predetermined value A, and thereby a total eighteen silicon single crystals were pulled. The magnetic field conditions were: the center magnetic field strength of 5000 G, 3000 G, 1000 G, 500 G and 10 G in the horizontal magnetic field, and a magnetic field strength at crucible wall (straight body part) of 2000 G in the cusp magnetic field.

Comparative Example

In the Comparative Example, a heat shielding member with a service life similar to that used in the example was provided, and an erroneous-detection-suppressing mechanism in a recess-shape was provided on the surface of the lower end of the heat shielding member and a criterion reflector having a tip end made of white quartz was attached inside the recess. Silicon single crystals were pulled in the same manner as in the example while the DPM 21 was measured and controlled to the predetermined value A using the silicon single crystal manufacturing apparatus having the same configuration as that of FIG. 1.

[Result]

Tables 1 and 2 below show the detection results of DPM 21 while pulling one crystal under each condition in Example and Comparative Example.

TABLE 1

| [DPM Detection Results in Example] | | | | |
|---|---|---|---|---|
| | | Predetermined DPM (mm) | | |
| | | 100 | 50 | 20 |
| Center Magnetic Field | 5000 | good | good | good |
| Strength [G] in | 3000 | good | good | good |
| Horizontal Magnetic | 1000 | good | good | good |
| Field | 500 | good | good | good |
| | 10 | good | good | good |
| Magnetic Field | 2000 | good | good | good |
| Strength at Crucible | (center 0) | | | |
| Wall [G] in Cusp | | | | |
| Magnetic Field | | | | |

TABLE 2

| [DPM Detection Results in Comparative Example] | | | | |
|---|---|---|---|---|
| | | Predetermined DPM (mm) | | |
| | | 100 | 50 | 20 |
| Center Magnetic Field | 5000 | good | good | good |
| Strength [G] in | 3000 | good | good | fair |
| Horizontal Magnetic | 1000 | good | fair | poor |
| Field | 500 | fair | poor | poor |
| | 10 | bad | bad | poor |
| Magnetic Field | 2000 | poor | poor | poor |
| Strength at Crucible | (center 0) | | | |
| Wall [G] in Cusp | | | | |
| Magnetic Field | | | | |

In Tables 1 and 2 above, an erroneous detection is defined as a case where the average detected value of the DPM 21 per minute deviates by 0.2% or more from the average detected value 1 minute before. "good" indicates that there was no erroneous detection during the pulling of the body of the crystal, "fair" indicates that there was an erroneous detection although it was infrequent, and "poor" indicates that DPM measurement and control became impossible due to erroneous detection.

As shown in Table 2, in Comparative Example, as the predetermined value A of the DPM 21, that is, the distance 21 between the lower end surface 11a of the heat shielding member 11 and the melt surface 3a of the raw material melt 3 becomes smaller (the predetermined DPM becomes narrower), it can be seen that the number of erroneous detection increased. This is presumably because, in Comparative Example, the amount of light increased due to multiple radiation from the melt surface 3a of the raw material melt 3 and the lower end surface 11a of the heat shielding member 11.

On the other hand, in Example, as is apparent from Table 1, the DPM 21 could be measured with high accuracy even when the DPM was narrow and the amount of light increased.

In addition, as is clear from Table 2, in Comparative Example, it was difficult to detect the reflector under weak magnetic field strength conditions. In Example, as is clear from Table 1, it was possible to measure and control the DPM 21 even in a horizontal magnetic field of several dozen G and a cusp magnetic field in which the central magnetic field strength is approximately 0 G.

That is, in Example, the distance between the surface of the raw material melt and the lower end surface of the heat shielding member could be measured and controlled more accurately than in Comparative Example.

As described above, according to the present invention, even under conditions where erroneous detection or detection itself has been difficult in the past, in the present invention, the through-hole to be detected pass the radiant light from the raw material melt, a strong light-and-shade contrast can be formed with the reflection portion of the lower end portion of heat shielding member other than the through-hole, detection by, for example, binary processing is facilitated, stable and highly accurate DPM measurement and control are possible. In the present invention, the crystal axis temperature gradient in the direction of the growth axis of the silicon single crystal can be controlled extremely precisely by manufacturing the silicon single crystal while thus controlling the DPM stably and with high accuracy, and, therefore, a high quality silicon single crystal can be efficiently produced.

The present invention is not limited to the above embodiments. The above-described embodiments are just examples, and any examples that substantially have the same configuration and demonstrate the same functions and effects as those in the technical concept disclosed in the claims of the present invention are included in the technical scope of the present invention.

The invention claimed is:

1. A method for measuring a distance between a lower end surface of a heat shielding member and a surface of a raw material melt, the method comprising providing the heat shielding member being located above the surface of the raw material melt, when a silicon single crystal is pulled by the Czochralski method while a magnetic field is applied to the raw material melt in a crucible, the method including:

forming a through-hole in the lower end surface of the heat shielding member;

actually measuring the distance between the lower end surface of the heat shielding member and the surface of the raw material melt, and observing a position of a mirror image of the through-hole with an optical camera, the mirror image being an image reflected on the surface of the raw material melt; and then measuring a moving distance of the mirror image by the optical camera, and calculating the distance between the lower end surface of the heat shielding member and the surface of the raw material melt from a value obtained in the actually measuring and the moving distance of the mirror image, during the pulling of the silicon single crystal, wherein while observing position of the mirror image of the through-hole, the through-hole is detected as a dark portion and the portion other than the through-hole is detected as a bright portion in the mirror image of the lower end of the heat shielding member projected on the surface of the raw material melt, and wherein the through-hole is surrounded on all sides by the heat shielding member.

2. The method for measuring the distance between the lower end surface of the heat shielding member and the surface of the raw material melt according to claim 1, wherein, in the actual measurement of the distance between the lower end surface of the heat shielding member and the surface of the raw material melt, a lower end of a seed crystal for growing the silicon single crystal is detected as a criterion position with a sensor provided above the raw material melt; then the lower end of the seed crystal is lowered to between the lower end surface of the heat shielding member and the surface of the raw material melt; the lower end of the seed crystal is brought into contact with the surface of the raw material melt by raising the crucible; and the distance between the lower end surface of the heat shielding member and the surface of the raw material melt is actually measured on a basis of a distance from a position of the contact to the criterion position and a distance from the lower end surface of the heat shielding member to the criterion position.

3. The method for measuring the distance between the lower end surface of the heat shielding member and the surface of the raw material melt according to claim 1, wherein a magnetic field strength at a center of the magnetic field applied is a horizontal magnetic field of 10 G to 5000 G.

4. The method for measuring the distance between the lower end surface of the heat shielding member and the surface of the raw material melt according to claim 2, wherein a magnetic field strength at a center of the magnetic field applied is a horizontal magnetic field of 10 G to 5000 G.

5. The method for measuring the distance between the lower end surface of the heat shielding member and the surface of the raw material melt according to claim 1, wherein the magnetic field applied is a cusp magnetic field.

6. The method for measuring the distance between the lower end surface of the heat shielding member and the surface of the raw material melt according to claim 2, wherein the magnetic field applied is a cusp magnetic field.

7. The method for measuring the distance between the lower end surface of the heat shielding member and the surface of the raw material melt according to claim 1, wherein a horizontal cross-sectional shape of the through-hole is circular or polygonal, and a diameter of the through-hole or a diameter of a circle circumscribing the through-hole is 4 mm or more and 20 mm or less.

8. The method for measuring the distance between the lower end surface of the heat shielding member and the raw material melt surface according to claim 7, wherein the diameter of the through-hole or the diameter of the circle circumscribing the through-hole is 8 mm or more and 15 mm or less.

9. A method for controlling the distance between the lower end surface of the heat shielding member and the surface of the raw material melt, wherein the crucible or the heat shielding member is moved while the silicon single crystal is pulled such that the distance between the lower end surface of the heat shielding member and the surface of the raw material melt becomes a predetermined value on a basis of feedback from a distance between the lower end surface of the heat shielding member and the surface of the raw material melt, the distance being measured by the method for measuring the distance between the lower end surface of the heat shielding member and the surface of the raw material melt according to claim 1.

10. A method for controlling the distance between the lower end surface of the heat shielding member and the surface of the raw material melt, wherein the crucible or the heat shielding member is moved while the silicon single crystal is pulled such that the distance between the lower end surface of the heat shielding member and the surface of the raw material melt becomes a predetermined value on a basis of feedback from the distance between the lower end surface of the heat shielding member and the surface of the raw material melt, the distance being measured by the method for measuring the distance between the lower end surface of the heat shielding member and the surface of the raw material melt according to claim 2.

11. A method for manufacturing the silicon single crystal, wherein the silicon single crystal is manufactured while the distance between the lower end surface of the heat shielding member and the surface of the raw material melt is controlled by the method for controlling the distance between the lower end surface of the heat shielding member and the surface of the raw material melt according to claim 9.

\*    \*    \*    \*    \*